(12) United States Patent
Gao et al.

(10) Patent No.: US 12,021,003 B2
(45) Date of Patent: Jun. 25, 2024

(54) SEMICONDUCTOR DEVICE PACKAGE WITH SEMICONDUCTIVE THERMAL PEDESTAL

(71) Applicant: Marvell Asia Pte, Ltd., Singapore (SG)

(72) Inventors: Han Gao, Richmond Hill (CA); Ershad Ali, Thousand Oaks, CA (US); Shrinath Ramdas, Agoura Hills, CA (US); Dwayne Richard Shirley, Pasadena, CA (US); Roberto Coccioli, Simi Valley, CA (US)

(73) Assignee: Marvell Asia Pte, Ltd., Singapore (SG)

( * ) Notice: Subject to any disclaimer, the term of this patent is extended or adjusted under 35 U.S.C. 154(b) by 275 days.

(21) Appl. No.: 17/444,964

(22) Filed: Aug. 12, 2021

(65) Prior Publication Data

US 2023/0051507 A1 Feb. 16, 2023

(51) Int. Cl.
| | |
|---|---|
| *H01L 23/367* | (2006.01) |
| *H01L 21/52* | (2006.01) |
| *H01L 21/56* | (2006.01) |
| *H01L 23/00* | (2006.01) |
| *H01L 23/04* | (2006.01) |
| *H01L 23/31* | (2006.01) |
| *H01L 23/373* | (2006.01) |
| *H01L 23/42* | (2006.01) |
| *H01L 23/552* | (2006.01) |

(52) U.S. Cl.
CPC ............ *H01L 23/367* (2013.01); *H01L 21/52* (2013.01); *H01L 21/56* (2013.01); *H01L 23/041* (2013.01); *H01L 23/3128* (2013.01); *H01L 23/3738* (2013.01); *H01L 23/42* (2013.01); *H01L 23/552* (2013.01); *H01L 24/16* (2013.01); *H01L 2224/16225* (2013.01)

(58) Field of Classification Search
CPC ....... H01L 23/367; H01L 21/52; H01L 21/56; H01L 23/041; H01L 23/3128; H01L 23/3738; H01L 23/42; H01L 23/552; H01L 24/16; H01L 2224/16225
See application file for complete search history.

(56) References Cited

U.S. PATENT DOCUMENTS

| | | | |
|---|---|---|---|
| 7,999,371 | B1 | 8/2011 | Arcedera et al. |
| 11,013,155 | B2 * | 5/2021 | Mun ................. H01L 23/49838 |
| 2006/0091530 | A1 | 5/2006 | Wang |
| 2007/0001298 | A1 | 1/2007 | Ozawa et al. |
| 2007/0296087 | A1 | 12/2007 | Ogata et al. |

(Continued)

FOREIGN PATENT DOCUMENTS

GB 1569452 6/1980

*Primary Examiner* — Eugene Lee

(57) ABSTRACT

A semiconductor device package includes a semiconductor die having two largest dimensions that define a major plane, a packaging material enclosing the semiconductor die, a plurality of contacts on a first exterior surface of the semiconductor device package that is parallel to the major plane, the first exterior surface defining a bottom of the semiconductor device package, and a pedestal of semiconductor material above the semiconductor die in a thermally-conductive, electrically non-conductive relationship with the semiconductor die. The semiconductor material of the pedestal may be doped to provide electromagnetic shielding of the semiconductor die.

17 Claims, 2 Drawing Sheets

(56) References Cited

U.S. PATENT DOCUMENTS

| | | | | |
|---|---|---|---|---|
| 2014/0150560 A1* | 6/2014 | O'Brien | ............... | G01L 9/12 |
| | | | | 73/728 |
| 2015/0041969 A1 | 2/2015 | Chang et al. | | |
| 2015/0145113 A1 | 5/2015 | Chen et al. | | |
| 2016/0043044 A1* | 2/2016 | Stuber | ............... | H01L 25/16 |
| | | | | 438/107 |
| 2019/0004571 A1* | 1/2019 | Sahu | ............... | G06F 1/182 |
| 2020/0365522 A1* | 11/2020 | Wang | ............... | H01L 23/427 |
| 2021/0035917 A1* | 2/2021 | Fay | ............... | H01L 23/3107 |
| 2021/0358831 A1* | 11/2021 | Kwon | ............... | H01L 23/544 |
| 2022/0344578 A1* | 10/2022 | Chuang | ............... | H10N 50/80 |

* cited by examiner

SEMICONDUCTOR DEVICE PACKAGE WITH SEMICONDUCTIVE THERMAL PEDESTAL

FIELD OF USE

This disclosure relates to the packaging of a semiconductor die. More particularly, the disclosure relates to packages and methods that include a semiconductive thermal pedestal element in thermal contact with the semiconductor die.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

A semiconductor device includes a semiconductor die on which the device circuits are formed. Typically, the semiconductor die is then protected by packaging. Within the semiconductor device package, the semiconductor die may be mounted on a supporting substrate with conductive interconnections. Leads connected to terminals of the semiconductor die are coupled to contacts on the outside of the semiconductor device package. The contacts frequently take the form of rigid metallic pins or, alternatively, conductive bumps or solder balls. The semiconductor die may be completely enclosed in the semiconductor device package, or one surface (e.g., where the semiconductor die is a rectangular solid, one of the two largest surfaces) may be exposed. The semiconductor die generates heat when in operation, and the package should allow for heat dissipation. In addition, it may be desirable for the package to provide a degree of shielding against electromagnetic interference.

SUMMARY

In accordance with implementations of the subject matter of this disclosure, a semiconductor device package includes a semiconductor die having two largest dimensions that define a major plane, a packaging material enclosing the semiconductor die, a plurality of contacts on a first exterior surface of the semiconductor device package that is parallel to the major plane, the first exterior surface defining a bottom of the semiconductor device package, and a pedestal of semiconductor material above the semiconductor die in a thermally-conductive, electrically non-conductive relationship with the semiconductor die.

A first implementation of such a semiconductor device package may further include a substrate layer below the semiconductor die and forming the first exterior surface.

A second implementation of such a semiconductor device package may further include a first layer of a thermal interface material between the semiconductor die and the pedestal. The thermal interface material may be thermally conductive and electrically non-conductive.

In a first aspect of that second implementation, the packaging material may include an upper layer closing the semiconductor device package above the pedestal, and the semiconductor device package may further include a second layer of the thermal interface material between a top surface of the pedestal and the upper layer of the packaging material.

In a first instance of that first aspect, the packaging material may be a molding material forming side walls of the semiconductor device package, and the upper layer may be formed from the molding material and be integrally molded with the side walls.

In a second instance of that first aspect, the packaging material may be a rigid material forming side walls of the semiconductor device package, and the upper layer may be a lid formed separately from the side walls, the lid resting in engagement with upper edges of the side walls.

In a third implementation of such a semiconductor device package, the pedestal may include silicon.

In a fourth implementation of such a semiconductor device package, the semiconductor material of the pedestal may be doped to provide electromagnetic shielding of the semiconductor die.

In a first aspect of that fourth implementation, the semiconductor material of the pedestal may be doped to an electrical conductivity of at least 20 Siemens/m.

According to implementations of the subject matter of this disclosure, a method of packaging a semiconductor die, where the semiconductor die has two largest dimensions that define a major plane, includes placing a pedestal of semiconductor material in a thermally conductive, electrically non-conductive relationship with a first surface of the semiconductor die parallel to the major plane, and enclosing at least sides of the semiconductor die, and the semiconductor pedestal, perpendicular to the major plane, in a packaging material.

In a first implementation of such a method, placing the pedestal of semiconductor material in the thermally conductive, electrically non-conductive relationship with a first surface of the semiconductor die parallel to the major plane may include depositing a first layer of a thermally-conductive, electrically nonconductive thermal interface material on a first surface of the semiconductor die parallel to the major plane, and placing the pedestal of semiconductor material in a thermally conductive relationship with the first layer of the thermal interface material.

A first aspect of that first implementation may further include depositing a second layer of the thermally-conductive, electrically nonconductive thermal interface material on a surface of the pedestal facing away from the semiconductor die. The enclosing may further include enclosing the second layer of the thermally-conductive, electrically nonconductive thermal interface material in the packaging material.

In a first instance of that first aspect, the enclosing may include molding a packaging material around the semiconductor die, the pedestal, and the first and second layers of thermal interface material.

A second instance of that first aspect may further include placing a substrate layer adjacent a second surface of the semiconductor die parallel to the major plane and opposite the first surface of the semiconductor die.

In a first variant of that second instance of the first aspect, the packaging material may be a rigid material and the enclosing may include forming side walls of the rigid packaging material perpendicular to the major plane and in engagement with the substrate layer, forming a lid separately from the side walls, and resting the lid in engagement with edges of the side walls remote from the substrate layer.

In a second implementation of such a method, placing the pedestal of semiconductor material in the thermally conductive, electrically non-conductive relationship with the first surface of the semiconductor die parallel to the major plane may include placing a pedestal comprising silicon in a thermally conductive, electrically non-conductive relationship with a first surface of the semiconductor die parallel to the major plane.

In a third implementation of such a method, placing the pedestal of semiconductor material in the thermally conductive, electrically non-conductive relationship with the first surface of the semiconductor die parallel to the major plane may include placing a pedestal comprising a doped semiconductor material in the thermally conductive, electrically non-conductive relationship with the first surface of the semiconductor die parallel to the major plane to provide electromagnetic shielding of the semiconductor die.

In a fourth implementation of such a method, placing the pedestal comprising the doped semiconductor material in the thermally conductive, electrically non-conductive relationship with the first surface of the semiconductor die parallel to the major plane may include placing a pedestal comprising a semiconductor material that is doped to an electrical conductivity of at least 20 Siemens/m in a thermally conductive, electrically non-conductive relationship with the first surface of the semiconductor die parallel to the major plane.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

Figure 1:
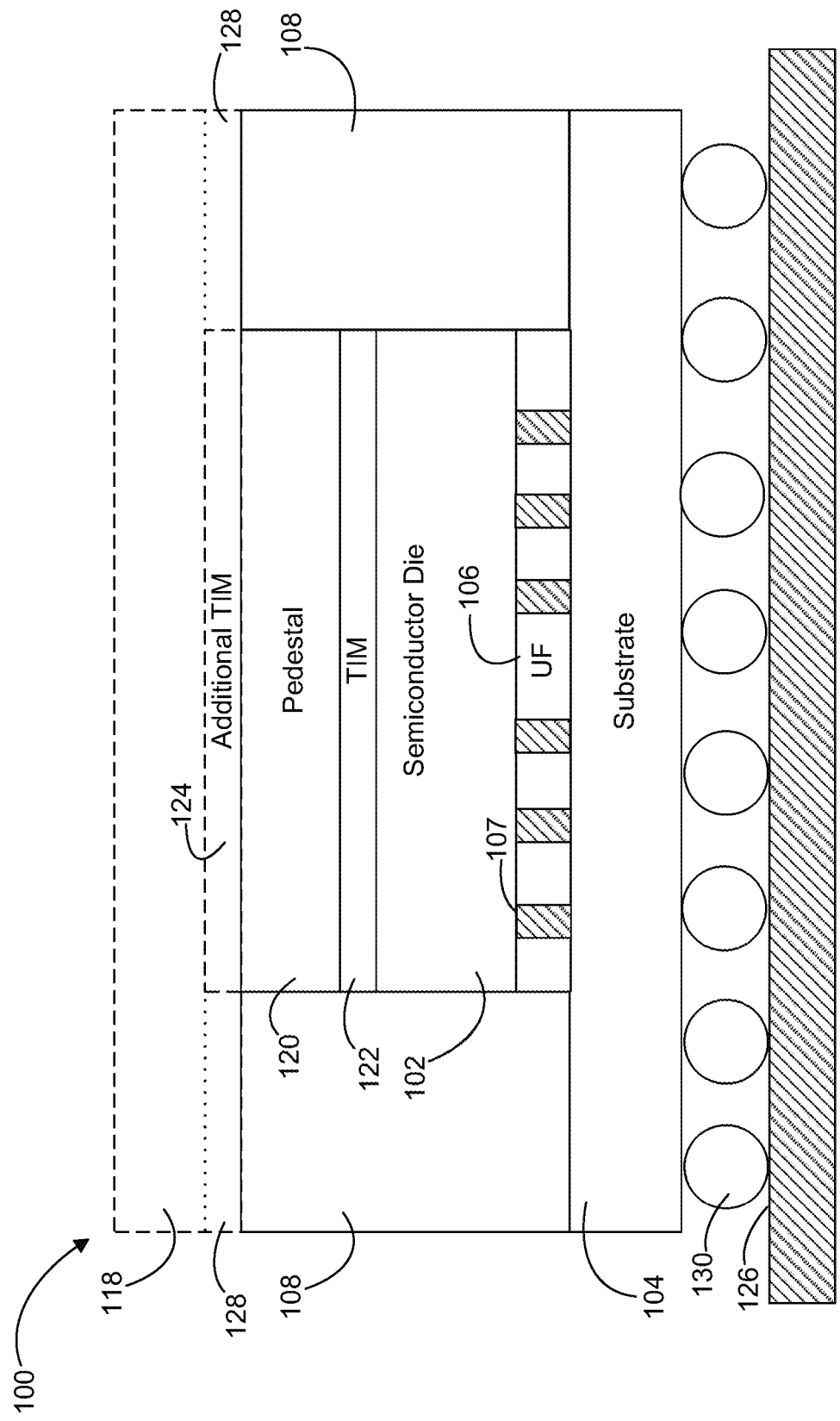
FIG. 1 is a vertical cross-sectional view of a semiconductor device package in accordance with implementations of the subject matter of this disclosure.

As noted above, a semiconductor die generates heat when in operation, and the package should allow for heat dissipation. In addition, it may be desirable for the package to provide a degree of shielding against electromagnetic interference. Moreover, semiconductor dice come in different sizes, including different thicknesses, and it may be advantageous to be able to accommodate different sizes of semiconductor dice in limited number of semiconductor device package form factors.

The foregoing objectives may be met, in accordance with implementations of the subject matter of this disclosure, by providing in a semiconductor device package a thermally conductive, electrically semiconductive, insert, which may be referred to as a "pedestal," which is positioned in a thermally conductive relationship, but an electrically non-conductive (or "floating") relationship, with the semiconductor die. In addition to serving as a spacer to conform the semiconductor die to a particular package dimension—which may be determined by dimensions of an apparatus in which the semiconductor device package may be used, or by dimensions of available semiconductor device packages—the thermally conductive pedestal assists in dissipating, to the ambient environment, heat generated by operation of the semiconductor die.

The material used as the pedestal can be chosen, at least in part, for its thermal conductivity. The specific thermal conductivity required for a particular implementation depends on the expected running temperature of the active semiconductor die and may be determined by simulation or experimentation.

For example, a typical single-crystal silicon semiconductor material has the following temperature-dependent thermal conductivity:

| Temperature (K) | Thermal Conductivity (W/m − K) |
| --- | --- |
| 200 | 264 |
| 250 | 191 |
| 300 | 148 |
| 350 | 119 |
| 400 | 98.9 |
| 500 | 76.2 |

In addition to having certain thermal characteristics, the pedestal may be made of an electrically semiconductive material—i.e., a semiconductor material—such as, e.g., silicon, and more particularly, either single-crystal or polycrystalline silicon. Alternatively, the semiconductor material may be a compound semiconductor such as, but not limited to, silicon-germanium (SiGe).

In some implementations, the semiconductor pedestal may be doped, so that the pedestal has a degree of conductivity that provides shielding against electromagnetic interference or noise, including, but not limited to, crosstalk and insertion loss. The dopant may include an N-type dopant (such as, e.g., phosphorus), or a P-type dopant (such as, e.g., boron). Typical doped silicon, for example, may have a conductivity in the range of from 1 Siemens/m to 100 Siemens/m. The particular conductivity to be achieved for effective shielding in a particular implementation may be determined by experimentation or simulation, but may be as low as about 20 Siemens/m. The presence of the dopant in concentrations sufficient to provide the desired electrical conductivity does not significantly impact thermal performance.

Considering the surface of the package, from which the pins or contacts (e.g., bump-array or ball-grid array contacts) extend, to be the "bottom" of the package, with the semiconductor die, or a substrate if used, at the bottom, the pedestal may be positioned "above" the semiconductor die. In a closed-type package—e.g., a molded package or a lidded package—a package wall will be disposed above the pedestal. But in an open-type package, where the package enclosure has a bottom wall and side walls, but no top wall, the upper surface of the pedestal will form the top surface of the package.

The pedestal should be in a thermally conductive relationship with the semiconductor die to dissipate heat, but, as noted, should be in an electrically non-conductive or floating relationship with the semiconductor die so as to be an effective electromagnetic shield. Therefore, in implementations of the subject matter of this disclosure, a thermal interface material (TIM), configured to establish a thermally conductive continuum in such implementations, is disposed between the semiconductor die and the pedestal. The TIM should be thermally conductive but electrically non-conductive. Suitable materials that may be used as the TIM include, but are not limited to, silicone adhesives and epoxy adhesives.

In an open-type ("exposed-die") package, there will be TIM between the semiconductor die and the pedestal, while the upper surface of the pedestal serves as the upper surface of the package. However, in a closed-type ("enclosed-die")

package—whether molded or lidded—there may also be TIM material between the upper surface of the pedestal and the underside of the upper layer of the package, to provide thermal conductivity from the pedestal through the upper layer of the package to the ambient environment.

Figure 2:
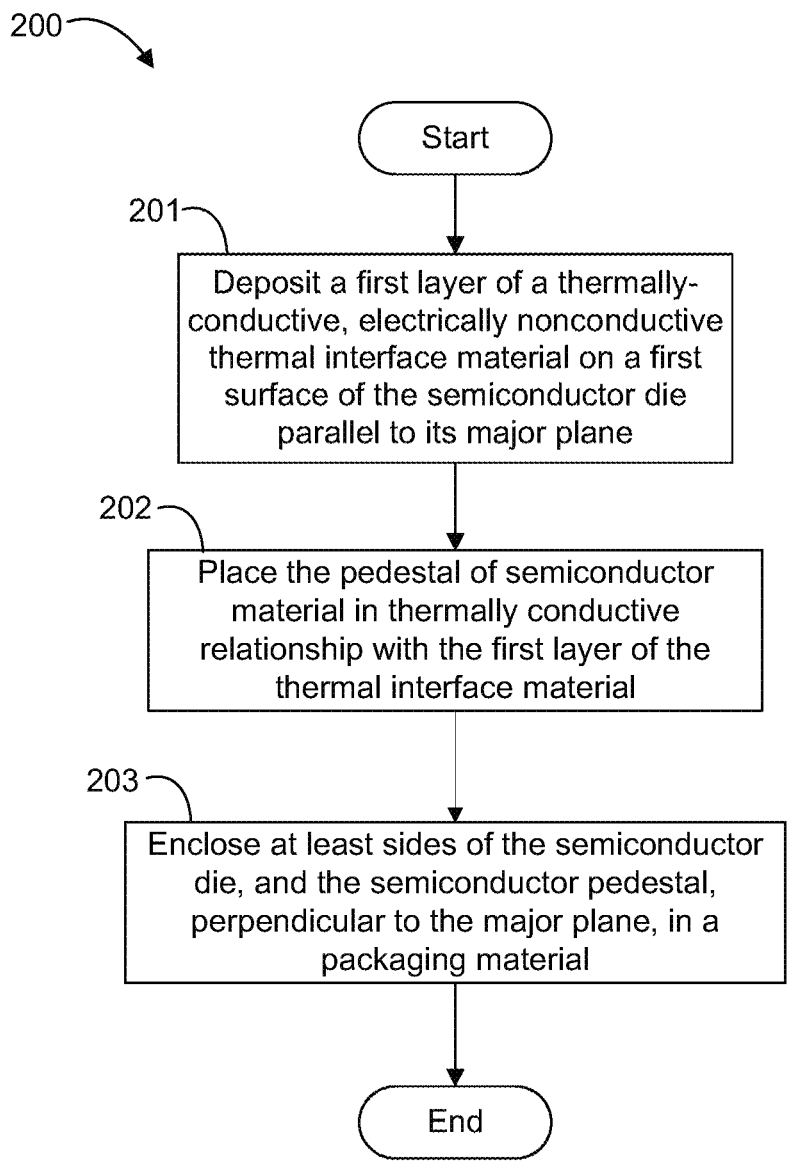
FIG. 2 is a flow diagram of a method of forming a semiconductor device package in accordance with implementations of the subject matter of this disclosure.

The subject matter of this disclosure may be better understood by reference to FIGS. 1 and 2.

FIG. 1 is a cross-sectional view of an integrated circuit package 100 according to implementations of the subject matter of this disclosure. Package 100 includes a semiconductor die 102 separated from an underlying substrate 104 by an underfill (UF) material 106.

Electrical conductivity between die 102 and the substrate 104 is afforded by conductive interconnects or bumps 107, which may have cylindrical, spherical or other suitable shapes. In some implementations, bumps 107 may be formed from a metal such as copper. Bumps 107, or other suitable connectivity structures, may be used to connect circuit components (not shown) on die 102 to exterior package contacts. The package contacts may be pins (not shown), or an array of bumps (i.e., a bump array; not shown) or solder balls 130 (i.e., a ball-grid array). The package contacts 130 may be used to conduct power and signals between the circuit components on die 102 and external circuitry, which, although not explicitly shown, may be disposed on printed circuit board 126 (which is not part of package 100). However, the connections between circuit components on die 102 and pillar bumps 107, and between pillar bumps 107 and package contacts 130, are not explicitly shown.

Package 100 further includes an enclosure 108 that protects the internal elements of package 100. In some implementations, enclosure 108 is a molded package formed from a molding material such as, e.g., an epoxy resin. In a molded package, underfill material 106, referred to above, may be the same as the molding material. In other implementations, enclosure 108 may be a rigid metallic or thermoset plastic structure.

Enclosure 108 may or may not include a cover portion (shown in phantom at 118). Some implementations may be a type of package referred as an exposed-die package, in which the top surfaces of the side walls of enclosure 108 are flush with a top surface of the package contents. Although such a package is referred to as an exposed-die package, and while in implementations outside the subject matter of this disclosure the exposed portion of the package contents may be the semiconductor die, in implementations of the subject matter of this disclosure the exposed portion of the package contents is the aforementioned pedestal 120, rather than die 102.

In other ("enclosed-die") implementations of the subject matter of this disclosure, the package contents may be completely covered. In an enclosed-die package where enclosure 108 is a molded enclosure, cover portion 118 may be molded integrally with the remainder of enclosure 108, or may be a separate lid. In other forms of enclosure 108, such as the aforementioned metallic or thermoset plastic packages, a separate lid may be provided. The separate lid may be made from the same material as the remainder of enclosure 108, or from a different material, and may be formed to leave a void that corresponds to the volume of the package contents, as described below.

Specifically, if cover portion 118 is a metallic lid, the metallic lid may be stamped or machined to leave a void of a specific height in enclosure 108. Similarly, if cover portion or lid 118 is made from a plastic material, then it may be molded or machined to leave a void of a specific height in enclosure 108. The specific height may be the height of the sidewalls of enclosure 108 in which case lid 118 would be flush with the tops of the sidewalls, or the height may be less than the height of the sidewalls of enclosure 108 in which case lid 118 would have (not shown) a portion that extends downward beneath the tops of the sidewalls of package 108. Or lid 118 (as shown) may have a downwardly-extending lip 128 that rests on the sidewalls, so that the void inside enclosure 108 extends above the sidewalls.

The total height of package 100 is determined by the combined thicknesses of the various layers of package 100 including, if present, the thickness of substrate 104, the thickness of semiconductor die 102 and the thickness of pedestal 120. The thickness of semiconductor die 102 may be determined at least in part by the circuitry to be formed in semiconductor die 102, which in turn is determined by the intended function. The thickness of substrate 104 is determined at least in part by the number of layers, which may be a function of electrical requirements, performance requirements, component density, etc. The thickness of substrate 104 also may be determined at least in part by the strength of the material of substrate 104 and the forces to which substrate 104 is expected to be subjected.

The thickness of pedestal 120 may be determined at least in part by the heat to be dissipated, based on the operating temperature of the circuitry on semiconductor die 106, although the target size of the overall package 100 also may factor in to the thickness of pedestal 120. In some implementations of the subject matter of this disclosure, the thickness of pedestal 120 may be selected in order to fill the void, described above, inside enclosure 108 left by a standard lid that, used in combination with the side walls of enclosure 108, has a predetermined height dimension. In some implementations, the height of a standard pedestal may be adapted to fit such a standard lid and provide a thermally conductive continuum, in combination with TIM, by selectively adapting the pedestal thickness, such as by grinding or other techniques for physically altering the pedestal thickness.

In one example, the thickness of semiconductor die 102 is about 200 μm, and the thickness of pedestal 120 is about 182 μm.

Pedestal 120 is designed to exhibit favorable thermally conductive properties to draw heat away from the semiconductor die 102 when semiconductor die 102 is active. Pedestal 120 has no separate electrical connections (e.g., to ground or to other package components), but may exhibit electrical conductivity that yields desirable electromagnetic shielding properties without allowing the unwanted short-circuiting of current from semiconductor die 102.

In some implementations, pedestal 120 is made from a semiconductor material. In particular implementations, the semiconductor material of pedestal 120 may include silicon. Single-crystal silicon may be used, but to minimize cost, polycrystalline silicon may be used instead. In other embodiments, pedestal 120 includes a compound semiconductor, and in further embodiments that compound semiconductor includes silicon (e.g., silicon-germanium).

To provide the desired electromagnetic characteristics, the material of pedestal 120 can be designed with particular electrical characteristics (e.g., bandgap) by, for example, doping the material of pedestal 120. Such dopant can be of P-type (e.g., including boron) or of N-type (e.g., including phosphorus). The specific dopant concentrations depend on the desired electrical characteristics and the particular dopant or dopants used, as well as on the particular semiconductor material used in pedestal 120. In some implementations, the dopant concentration may provide a conductivity in pedestal 120 of between 1 Siemens/m and 100 Siemens/m. In a particular implementation, the conductivity of pedestal 120 is about 20 Siemens/m.

Because there should be good thermal contact, but no electrical contact, between semiconductor die 102 and pedestal 120 in order for pedestal 120 to serve its function of conducting heat away from semiconductor die 102 but also to serve as electromagnetic shielding (if doped), a further layer of thermal interface material 122, which is thermally conductive, but electrically non-conductive, is provided between semiconductor die 102 and pedestal 120. As previously noted, a suitable thermally conductive, electrically non-conductive, material to serve as TIM 122 may be silicone adhesive or an epoxy adhesive.

If package 108 is an exposed-die package, heat dissipation from pedestal 120 to the environment is straightforward because pedestal 120 is open to the environment. However, if package 108 is not an exposed-die package, then to facilitate heat dissipation from pedestal 120 to the ambient environment, there should be good thermal contact between pedestal 120 and the upper layer or lid 118 of package 108. To that end, an additional TIM layer 124 may be provided to assure such thermal contact between pedestal 120 and the upper layer or lid 118 of package 108, allowing heat to be conducted from pedestal 120 to upper layer or lid 118 of package 108, which then conducts or radiates the heat to the ambient environment. Although in FIG. 1 TIM layer 124 is disposed in a void volume provided by the presence of lip 128 depending from lid 118, in other implementations in which lid 118 has no lip 128, the sidewalls of package 108 may simply be made higher than the upper surface of pedestal 120 to provide space for TIM layer 124 between pedestal 120 and lid 118.

As noted above, underfill (UF) molding material 106 is disposed between semiconductor die 102 and substrate 104 to fill any gaps therebetween. Underfill (UF) molding material 106 may be capillary underfill (CUF) or epoxy molding compound underfill (MUF), which may be the same as the material used for the walls of semiconductor device package 108 if semiconductor device package 108 is of the molded type.

A semiconductor device package featuring pedestal element 120 may offer various benefits. For example, the inclusion of a pedestal element 120 according to an implementation of the subject matter of this disclosure can enhance package electrical performance by reducing undesired interference phenomena, such as crosstalk and/or insertion loss.

In addition, the inclusion of a pedestal element 120 according to an implementation of the subject matter of this disclosure allows the provision of semiconductor device packages with uniform heights notwithstanding differences in semiconductor die thickness, by adjusting the thickness of pedestal element 120 to adjust the overall package height.

In addition to the thermal and electromagnetic benefits of including pedestal element 120, the presence of pedestal element 120 allows semiconductor die 102 to be thinner than if there were no pedestal 120. The combination of the two thinner layers of pedestal element 120 and semiconductor die 102, separated by compliant TIM layer 124, also may reduce mechanical stress on semiconductor die 102 caused by bumps 107.

A method 200 in accordance with implementations of the subject matter of this disclosure for packaging a semiconductor die is diagrammed in FIG. 2. At 201, a first layer of a thermally-conductive, electrically nonconductive thermal interface material is deposited on a first surface of the semiconductor die parallel to its major plane. At 202, a pedestal of semiconductor material is placed in a thermally conductive relationship with the first layer of the thermal interface material.

At 203, at least sides of the semiconductor die, and the semiconductor pedestal, perpendicular to the major plane, are enclosed in a packaging material. The bottom of the package, which may be the underside of a substrate, or may be the underside of the semiconductor die if no substrate is used, also may be enclosed in the packaging material. For an exposed-die package, the upper surface of the pedestal is not covered. However, for an enclosed-die package, the upper surface of the pedestal also may be enclosed. Method 200 then ends.

In alternative implementations (not shown in FIG. 2), the sidewalls of the packaging materials may be formed before all of the layers to be enclosed have been deposited. For example, after the semiconductor die has been deposited on the substrate, the sidewalls may be formed and then a layer of TIM and the pedestal may be inserted within the sidewalls above the semiconductor die. If the implementation is an enclosed-die implementation, additional TIM and a lid may then be deposited.

Thus it is seen that a semiconductor device package that provides heat dissipation, and may also provide electromagnetic shielding, while ameliorating stress and accommodating different die thicknesses, has been provided.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. A semiconductor device package comprising:
   a semiconductor die;
   a packaging material enclosing the semiconductor die;
   a first exterior surface of the semiconductor device package, the first exterior surface defining a bottom of the semiconductor device package and having a plurality of contacts thereon; and
   a pedestal of semiconductor material above the semiconductor die in a thermally-conductive, electrically non-conductive relationship with the semiconductor die, the semiconductor material of the pedestal being doped to an electrical conductivity between 20 Siemens/m and 100 Siemens/m to provide electromagnetic shielding of the semiconductor die.

2. The semiconductor device package of claim 1 further comprising a substrate layer below the semiconductor die and forming the first exterior surface.

3. The semiconductor device package of claim 1 further comprising:
   a first layer of a thermal interface material between the semiconductor die and the pedestal; wherein:
   the thermal interface material is thermally conductive and electrically non-conductive.

4. The semiconductor device package of claim 3 wherein:
   the packaging material includes an upper layer closing the semiconductor device package above the pedestal; the semiconductor device package further comprising:
   a second layer of the thermal interface material between a top surface of the pedestal and the upper layer of the packaging material.

5. The semiconductor device package of claim 4 wherein:
the packaging material is a molding material forming side walls of the semiconductor device package; and
the upper layer is formed from the molding material and is integrally molded with the side walls.

6. The semiconductor device package of claim 4 wherein the packaging material is a rigid material forming side walls of the semiconductor device package; and
the upper layer is a lid formed separately from the side walls, the lid resting in engagement with upper edges of the side walls.

7. The semiconductor device package of claim 1 wherein the pedestal comprises silicon.

8. The semiconductor device package of claim 1 wherein the semiconductor material of the pedestal is doped to an electrical conductivity of 20 Siemens/m.

9. A method of packaging a semiconductor die in a semiconductor device package having a first exterior surface of the semiconductor device package, the first exterior surface defining a bottom of the semiconductor device package and including a plurality of contacts thereon, the method comprising:
placing a pedestal comprising a semiconductor material, that is doped to an electrical conductivity between 20 Siemens/m and 100 Siemens/m, in a thermally conductive, electrically non-conductive relationship with a first surface of the semiconductor die parallel to the first exterior surface of the semiconductor device package to provide electromagnetic shielding of the semiconductor die; and
enclosing at least sides of the semiconductor die, and the semiconductor pedestal, perpendicular to the first exterior surface of the semiconductor device package, in a packaging material.

10. The method of packaging a semiconductor die according to claim 9, wherein placing the pedestal of semiconductor material in the thermally conductive, electrically non-conductive relationship with the first surface of the semiconductor die parallel to the first exterior surface of the semiconductor device package comprises:
depositing a first layer of a thermally-conductive, electrically nonconductive thermal interface material on the first surface of the semiconductor die parallel to the first exterior surface of the semiconductor device package; and
placing the pedestal of semiconductor material in a thermally conductive relationship with the first layer of the thermal interface material.

11. The method of packaging a semiconductor die according to claim 10, the method further comprising:
depositing a second layer of the thermally-conductive, electrically nonconductive thermal interface material on a surface of the pedestal facing away from the semiconductor die; wherein:
the enclosing further comprises enclosing the second layer of the thermally-conductive, electrically nonconductive thermal interface material in the packaging material.

12. The method of packaging a semiconductor die according to claim 11, wherein the enclosing comprises molding the packaging material around the semiconductor die, the pedestal, and the first and second layers of thermal interface material.

13. The method of packaging a semiconductor die according to claim 11, further comprising placing a substrate layer adjacent a second surface of the semiconductor die parallel to the first exterior surface of the semiconductor device package and opposite the first surface of the semiconductor die.

14. The method of packaging a semiconductor die according to claim 13 wherein the packaging material is a rigid material and the enclosing comprises:
forming side walls of the rigid packaging material perpendicular to the first exterior surface of the semiconductor device package and in engagement with the substrate layer;
forming a lid separately from the side walls; and
resting the lid in engagement with edges of the side walls remote from the substrate layer.

15. The method of packaging a semiconductor die according to claim 9 wherein:
placing the pedestal of semiconductor material in the thermally conductive, electrically non-conductive relationship with the first surface of the semiconductor die parallel to the first exterior surface of the semiconductor device package comprises placing a pedestal comprising silicon in a thermally conductive, electrically non-conductive relationship with the first surface of the semiconductor die parallel to the first exterior surface of the semiconductor device package.

16. The method of packaging a semiconductor die according to claim 9 wherein:
placing the pedestal comprising the doped semiconductor material in the thermally conductive, electrically non-conductive relationship with the first surface of the semiconductor die parallel to the first exterior surface of the semiconductor device package comprises placing a pedestal comprising a semiconductor material that is doped to an electrical conductivity of 20 Siemens/m in the thermally conductive, electrically non-conductive relationship with the first surface of the semiconductor die parallel to the first exterior surface of the semiconductor device package to provide electromagnetic shielding of the semiconductor die.

17. The semiconductor device package of claim 1 wherein the pedestal is coextensive with the semiconductor die in a plane parallel to the first exterior surface of the semiconductor device package.

* * * * *